(12) United States Patent
Zheng et al.

(10) Patent No.: US 7,081,378 B2
(45) Date of Patent: Jul. 25, 2006

(54) HORIZONTAL TRAM AND METHOD FOR THE FABRICATION THEREOF

(75) Inventors: Jia Zhen Zheng, Singapore (SG); Weining Li, Singapore (SG); Tze Ho Simon Chan, Singapore (SG); Pradeep Ramachandramurthy Yelehanka, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 135 days.

(21) Appl. No.: 10/752,357

(22) Filed: Jan. 5, 2004

(65) Prior Publication Data

US 2005/0148118 A1    Jul. 7, 2005

(51) Int. Cl.
*H01L 21/332* (2006.01)
(52) U.S. Cl. ......................... 438/135; 438/279; 438/589
(58) Field of Classification Search ................ 438/133, 438/135, 589, 279
See application file for complete search history.

(56) References Cited

U.S. PATENT DOCUMENTS

| | | | | |
|---|---|---|---|---|
| 5,578,522 A | * | 11/1996 | Nakamura et al. | 438/138 |
| 5,838,026 A | * | 11/1998 | Kitagawa et al. | 257/139 |
| 6,229,161 B1 | | 5/2001 | Nemati et al. | |
| 6,448,586 B1 | | 9/2002 | Nemati et al. | |
| 6,690,039 B1 | * | 2/2004 | Nemati et al. | 257/133 |
| 6,696,323 B1 | * | 2/2004 | Yamaguchi et al. | 438/138 |
| 6,727,528 B1 | * | 4/2004 | Robins et al. | 257/133 |
| 6,913,955 B1 | * | 7/2005 | Horch et al. | 438/133 |
| 2005/0026337 A1 | * | 2/2005 | Quek et al. | 438/135 |
| 2005/0148118 A1 | * | 7/2005 | Zheng et al. | 438/133 |

* cited by examiner

*Primary Examiner*—M. Wilczewski
(74) *Attorney, Agent, or Firm*—Mikio Ishimaru

(57) ABSTRACT

A method for manufacturing an integrated circuit structure includes providing a semiconductor substrate and forming a trench therein. A thyristor is formed around the trench and within the semiconductor substrate. The thyristor has at least four layers with three P-N junctions therebetween. A gate for the thyristor is formed within the trench. An access transistor is formed on the semiconductor substrate. An interconnect is formed between the thyristor and the access transistor.

15 Claims, 5 Drawing Sheets

HORIZONTAL TRAM AND METHOD FOR THE FABRICATION THEREOF

TECHNICAL FIELD

The present invention relates generally to semiconductor integrated circuit devices and methods for the production thereof, and more particularly to thyristor-based SRAM devices.

BACKGROUND ART

Contemporary computers, cellular telephones, radios, televisions, and other electronic equipment are constructed using semiconductor microprocessors, integrated circuits, memory chips, and the like. These semiconductor components, which are characteristically fabricated on a semiconductor substrate, are constructed using various microelectronic devices such as transistors, capacitors, diodes, resistors, and so forth. Each microelectronic device is typically a pattern of conductor, semiconductor, and insulator regions formed on the semiconductor substrate.

The electronics industry continues to strive for increasingly higher-powered and higher-functioning circuits by device miniaturization and by creating multifunction devices on a single semiconductor chip or die.

Very large-scale integrated circuits on small areas of silicon wafers are manufactured through a series of steps carried out in a particular order. The main objectives include obtaining a device that occupies as small an area as possible and consumes low levels of power using low voltage supply levels, while performing at speeds comparable to speeds realized by much larger devices.

An important part in the circuit construction and manufacture of semiconductor devices concerns data storage, or semiconductor memories; the circuitry used to store digital information. The construction and formation of such memory circuitry typically involves forming at least one storage element and forming associated circuitry designed to access the stored information. In applications where circuit space, power consumption, circuit speed, and reliability are primary design goals, the construction and layout of memory devices can be very important.

Dynamic read/write random-access memory ("DRAM") is a type of volatile memory in which the data stored at each location is periodically refreshed by reading it and then writing it back again to the same location, or else it disappears. Static read/write random-access memory ("SRAM") is a type of volatile memory in which the data, once it is written to a memory location, remains stored there as long as power is applied to the memory chip (unless, of course, the data is deliberately changed by replacing it with new data).

SRAM and DRAM often compromise one or more of the primary design goals of smaller circuit space, lower power consumption, and faster circuit speed. For instance, some SRAMs include circuit structures that compromise at least one of these primary de sign goals. An example is a conventional SRAM based on a four-transistor ("4T") cell, or a six-transistor ("6T") cell, that has four cross-coupled transistors or two transistors and two resistors, plus two cell-access transistors. Such cells have the advantage that they are compatible with mainstream complimentary metal oxide semiconductor ("CMOS") technology, consume relatively low levels of standby power, operate at low voltage levels, and perform at relatively high speeds. However, the 4T and 6T cells are conventionally configured using a large cell area; and this large area significantly and undesirably limits the maximum density of such SRAMs.

Other SRAM cell designs are based on negative differential resistance ("NDR") devices. These usually consist of at least two active elements, including the NDR device. The structure and operating characteristics of the NDR device are particularly important to the overall performance of this type of SRAM cell. A variety of NDR devices has been introduced, ranging from a simple bipolar transistor to complicated quantum-effect devices. The biggest advantage of the NDR-based memory cell is the potential of having a cell area smaller than that of 4T and 6T memory cells because of the smaller number of active devices and interconnections needed in the NDR design.

Conventional NDR-based SRAM cells, however, have many problems that have inhibited their use in commercial SRAM products. Some of these problems include: high standby power consumption due to the large current needed in one or both of the stable memory states of the cell; excessively high or excessively low voltage levels needed for the cell operation; stable states that are too sensitive to manufacturing variations and provide poor noise-margins; limitations in access speed due to slow switching from one stable state to the other; and manufacturability and yield issues due to complicated fabrication processing.

One NDR device is the "thyristor" (from the Greek thyra, meaning "door", which suggests something that is either open or closed, and thus either on or off). Thyristors are widely used in power switching applications because the current densities carried by such devices can be very high when in their "on" state.

A thyristor is a four-layer semiconductor device consisting of alternating N-type and P-type semiconductor materials (i.e., "NPNP"), with three P-N junctions. Thyristors usually have three electrodes: an anode, a cathode, and a gate (or control electrode).

A thyristor can be turned on by an initial current at the gate, and once it is turned on it then does not require any more control (gate) current to continue to conduct. Instead, it will continue to conduct until a minimum holding current is no longer maintained between the anode and cathode, or until the voltage between the anode and the cathode is reversed.

A thyristor can thus switch or control large amounts of power using but a small triggering (or control) current or voltage. Thyristors, then, act like a semiconductor analog of a mechanical switch—the two stable states are "on" and "off," with nothing in between. Thyristors are used, among many applications, in motor speed controls, light dimmers, pressure-control systems, and liquid-level regulators.

For use in electronic applications, however, a significant difficulty with thyristor devices is that once switched to their on state, they remain in this state until the current is reduced below the device holding current. Also, in general, when the main thyristor current is interrupted (to turn the thyristor off), the time required for the thyristor to return to the off state is largely determined by the lifetimes of the current carriers in the device, and in electronic terms this can be quite long.

This inability to switch the device off without interrupting the current, and the associated slow switching speed, are significant problems in many applications and have resulted in many attempts to modify the device structures so that they can be actively and rapidly switched off.

A prior design directed to these concerns appears in U.S. Pat. Nos. 6,229,161 and 6,448,586 (both to Nemati et al.). The descriptions are directed to capacitively-coupled NDR devices such as thyristors, and to circuit applications for such structures. These devices are described as having advantages for use in designs that need NDR devices having improved on/off switching speeds and a low holding current when in the on state. They are said to be unlike many NDR devices such as conventional thyristor structures that slowly turn off due to the saturation of their junctions in the on state, and/or which may not turn off at all until the current is reduced below the holding current. Instead, the devices in these patents are directed to capacitively-coupled thyristor devices that quickly switch between a current-passing mode and a current-blocking mode in response to a capacitively-coupled activation signal that is presented adjacent a particular region of the capacitively-coupled NDR device. The switch or change from one state to the other occurs using a relatively low voltage, and the devices can be implemented in a relatively small area.

A thyristor-based random access memory ("TRAM") array having a plurality of such TRAM cells could have a density equivalent to that of DRAM arrays and a speed equivalent to that of SRAM arrays. Hence, such a TRAM array could provide the advantages afforded by both SRAM and DRAM arrays. These advantages make such a TRAM attractive for possible use in future generations of high speed, low-voltage, and high-density memories.

However, the TRAM cell disclosed in these patents presents several major drawbacks. For example, the entire thyristor is formed in a vertical silicon pillar, requiring epitaxial processing to form the vertical configuration. This is not compatible with conventional bulk CMOS processing.

In addition, the thyristor SRAM cell (TRAM) sits in a P-well in a bulk silicon substrate. This results in a large difference in elevation between the contact on the top P+ region of the thyristor and other contacts in the device.

Also, additional masking, implantation and diffusion steps are needed to form the bottom N+ region of the thyristor.

There is also potential incompatibility with salicidation. Additionally, difficulties can arise in controlling the dimensions of the vertical pillar and reproducing these dimensions for each TRAM cell in a TRAM array.

Also, due to the existence of a vertical thyristor in each TRAM cell, the TRAM cells as a whole are not planar and are therefore difficult to scale to larger configurations.

Additionally, since each TRAM cell is fabricated prior to or after fabricating other devices (such as positive-channel metal-oxide semiconductor ("PMOS") and negative-channel metal-oxide semiconductor ("NMOS") supporting devices) that are connected to it, extra fabrication steps and increased manufacturing costs are incurred.

Thus, while there is a growing trend to realize an SRAM cell by using the TRAM combination of an NPNP junction connected to an NMOS transistor for ultra-high cell density, the incompatibility with conventional bulk CMOS processing makes such embedded SRAM design difficult.

Solutions to problems of this sort have been long sought, but have long eluded those skilled in the art.

DISCLOSURE OF THE INVENTION

The present invention provides a method for manufacturing an integrated circuit structure. A semiconductor substrate is provided and a trench is formed therein. A thyristor is formed around the trench and within the semiconductor substrate, the thyristor having at least four layers with three P-N junctions therebetween. A gate for the thyristor is formed within the trench. An access transistor is formed on the semiconductor substrate; and an interconnect is formed between the thyristor and the access transistor. Thus, there is provided a thyristor-based SRAM and advanced methods for the fabrication thereof that alleviate the contact-formation problems due to the large height difference among contacts in the cell, that reduce the number of implantation steps, that do not require epitaxial formation procedures, and that allow salicidation. Further, the advanced device structures and methods use existing bulk processing techniques, thereby avoiding additional complexity and expense in the fabrication and manufacturing processes so as to be highly manufacturable, reliable, scalable, repeatable and economical to produce.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

In the following description, numerous specific details are given to provide a thorough understanding of the invention. However, it will be apparent to one skilled in the art that the invention may be practiced without these specific details. In order to avoid obscuring the present invention, some well-known configurations and process steps are not disclosed in detail. Also, the drawings showing embodiments of the apparatus are semi-diagrammatic and not to scale and, particularly, some of the dimensions are for the clarity of presentation and may be shown exaggerated in the FIGs.

The term "horizontal" as used herein is defined as a plane parallel to the conventional plane or surface of a wafer or substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane. The term "processing" as used herein includes deposition of material or photoresist, patterning, exposure, development, etching, cleaning, and/or removal of the material or photoresist as required in forming a described structure.

Figure 1:
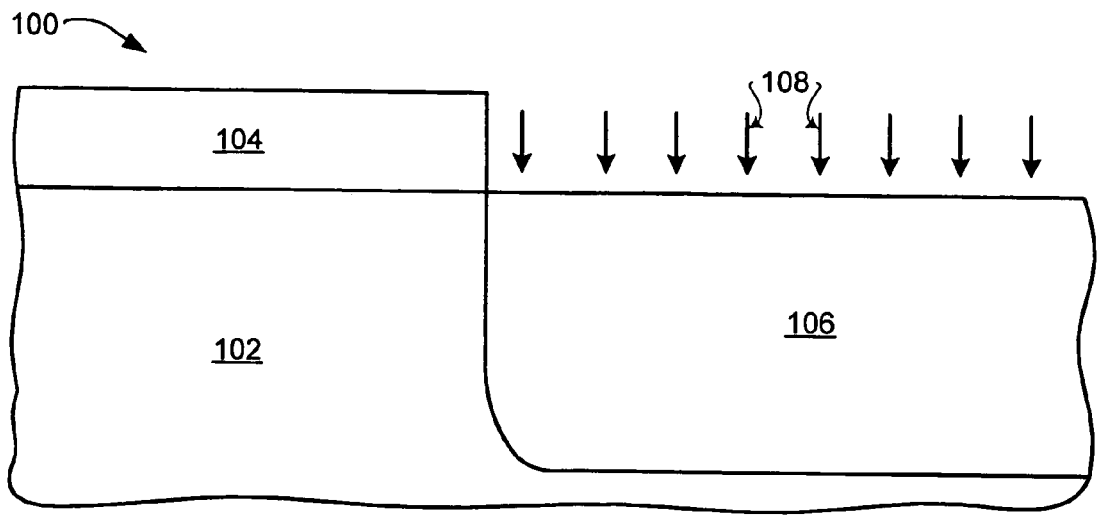
FIG. 1 is a cross-sectional view of a silicon wafer in the first stages of processing in accordance with the present invention.

Referring now to FIG. 1, therein is shown a cross-section of a silicon ("Si") wafer 100 in the first stages of processing to fabricate a horizontal static read/write random-access memory ("SRAM") that is thyristor-based ("TRAM"). The thyristor is a negative differential resistance ("NDR") device having alternating N-type and P-type ("NPNP") semiconductor materials.

A semiconductor substrate 102, typically of silicon, has an N-well mask 104 patterned and formed on the semiconductor substrate 102. The N-well mask 104 defines a region for an N-well implantation 106, the implantation being illustrated by N-implantation arrows 108.

Figure 2:
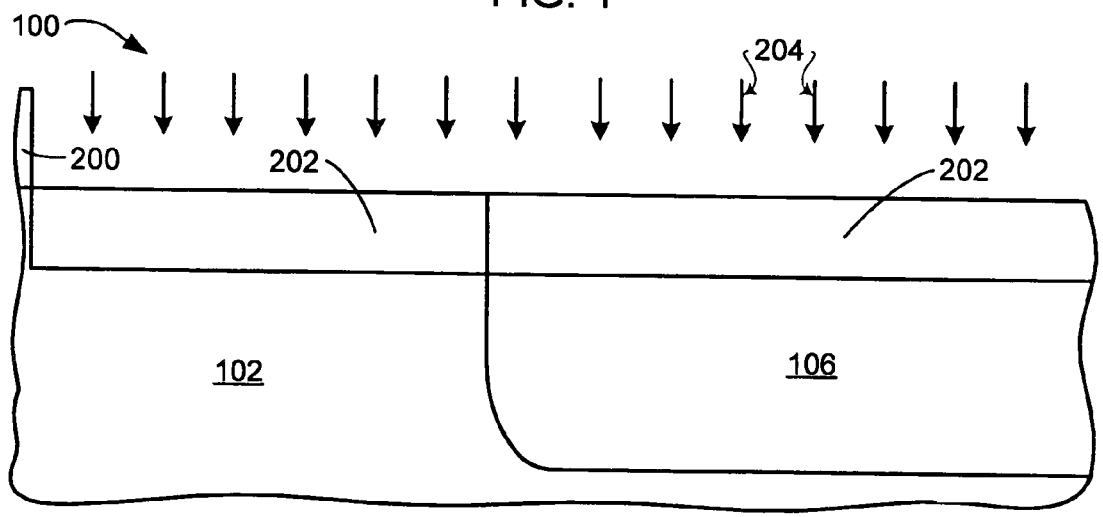
FIG. 2 is the structure of FIG. 1 after removal of an N-well mask and formation of a P-well mask in accordance with the present invention.

Referring now to FIG. 2, therein is shown the structure of FIG. 1 following removal of the N-well mask 104 (FIG. 1) and the patterning and deposition of a P-well mask 200. The P-well mask 200 defines a region for a P-well implantation 202, the implantation being illustrated by P+ implantation arrows 204.

Figure 3:
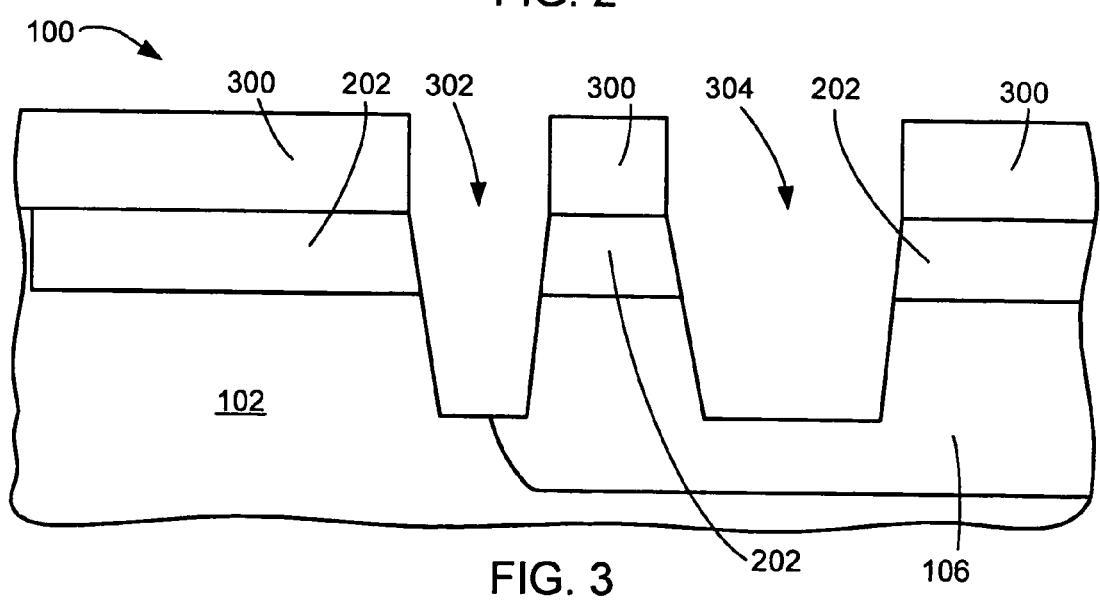
FIG. 3 is the structure of FIG. 2 after removal of the P-well mask and formation of an active mask for forming shallow trench isolations.

Referring now to FIG. 3, therein is shown the structure of FIG. 2 following removal of the P-well mask 200 (FIG. 2) and patterning and formation of an active mask 300 for forming shallow trench isolations ("STI's"). The areas of the semiconductor substrate not protected by the active mask 300 are then etched to form two STI trenches, as follows. A first STI trench 302 straddles the N-well implantation 106 and the unimplanted portion under the P-well implantation 202 of the semiconductor substrate 102 at and near its surface, thus extending both inside and outside the N-well implantation 106, as illustrated. A second STI trench 304 is formed entirely within the N-well implantation 106 for later use in forming a thyristor 808 (FIG. 8) according to the present invention.

Figure 4:
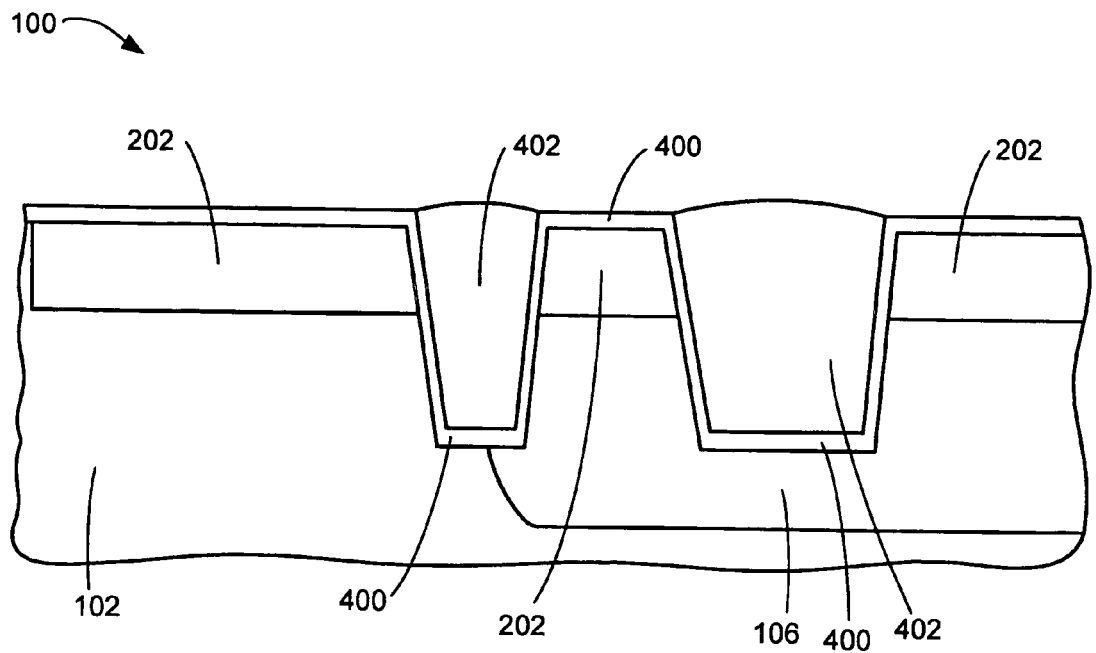
FIG. 4 is the structure of FIG. 3 after removal of the active mask, formation of an oxide liner, and filling of the trenches in accordance with the present invention.

Referring now to FIG. 4, therein is shown the structure of FIG. 3 following removal of the active mask 300 (FIG. 3) and formation of an oxide liner 400 (typically SiO2) on the P-well implantation 202 and the STI trenches. The first STI trench 302 and the second STI trench 304 (FIG. 3) are then filled by an STI gapfill 402, followed by chemical-mechanical planarization ("CMP").

Figure 5:
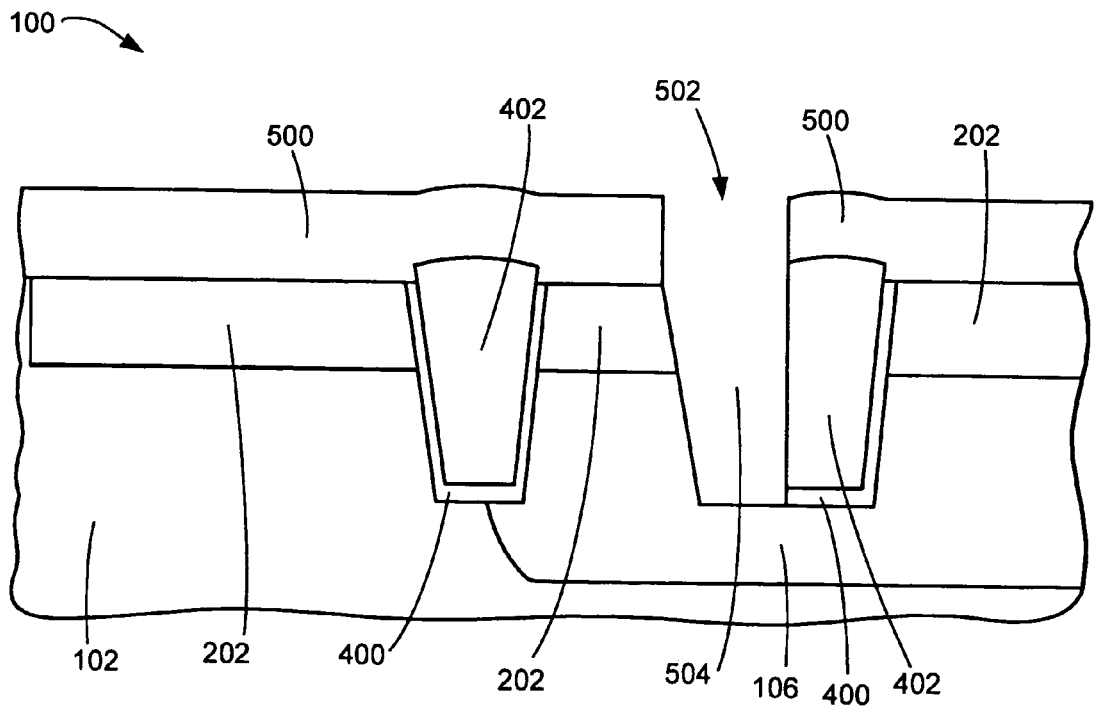
FIG. 5 is the structure of FIG. 4 after removal of the exposed portions of the oxide liner, formation of a Poly mask, and etching of a thyristor gate well.

Referring now to FIG. 5, therein is shown the structure of FIG. 4 following removal of the exposed portions of the oxide liner 400 (i.e., those portions not covered by the STI gapfill 402). A polymorphous Si ("Poly") mask 500 is then formed to define an opening 502 for forming a thyristor gate well 504 within the second STI trench 304 (FIG. 3). The thyristor gate well 504 is then formed through the opening 502 by means of an STI etch which also removes the portion of the oxide liner 400 therebeneath.

Figure 6:
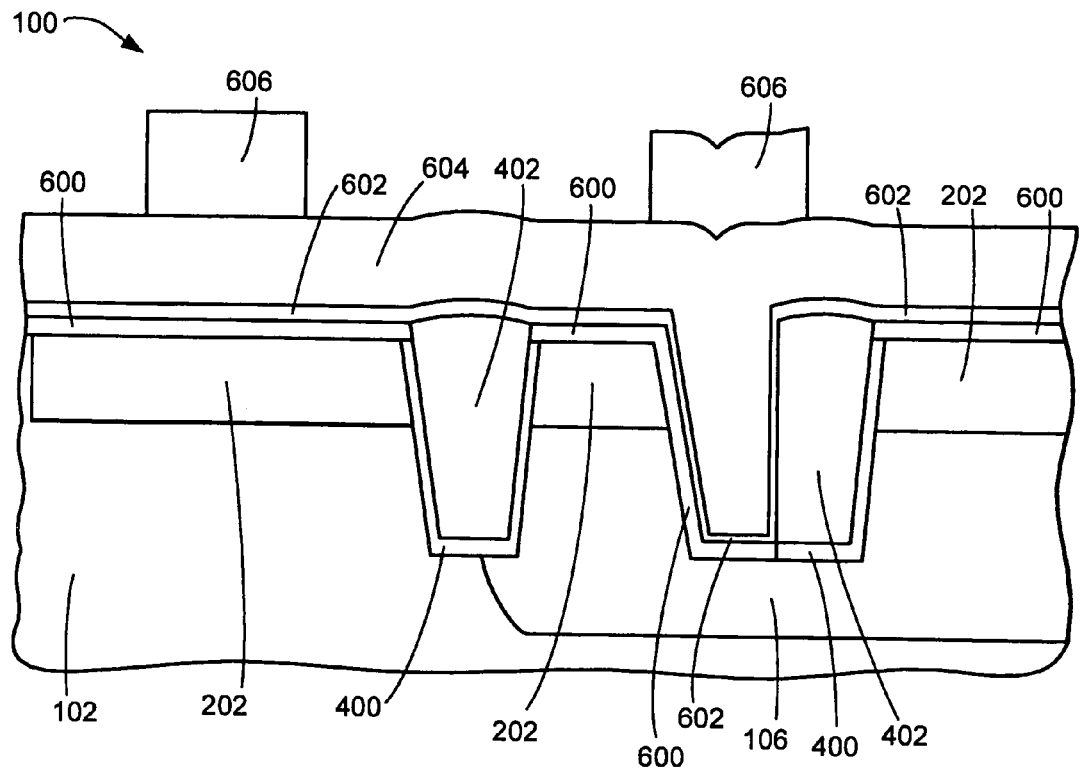
FIG. 6 is the structure of FIG. 5 after removal of the Poly mask and formation of a tetraethylorthosilicate (TEOS) liner on and across the semiconductor substrate in accordance with the present invention.

Referring now to FIG. 6, therein is shown the structure of FIG. 5 following removal of the Poly mask 500 (FIG. 5). A gate oxide layer 600 has been grown on and across the semiconductor substrate 102 and the various structures thereon, followed by formation of a tetraethylorthosilicate ("TEOS") liner 602 on the gate oxide layer 600. A Poly layer 604 is then deposited on the TEOS liner 602, and a gate mask 606 is patterned and deposited on the Poly layer 604.

Figure 7:
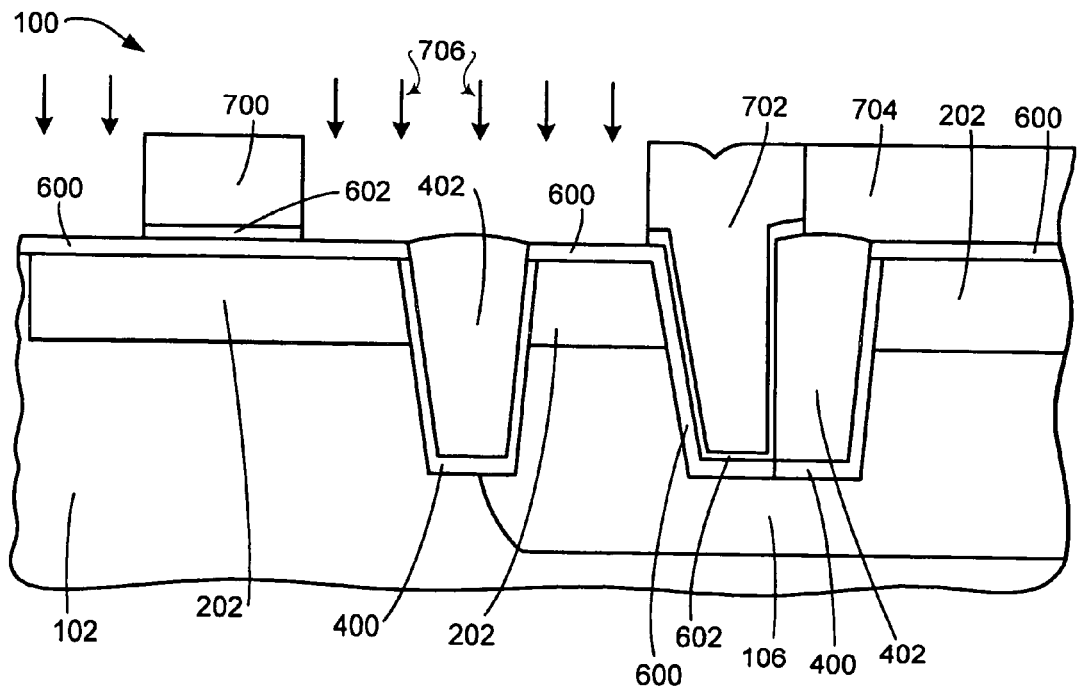
FIG. 7 is the structure of FIG. 6 after etching to form an access transistor gate and a thyristor gate and forming a mask in accordance with the present invention.
Figure 8:
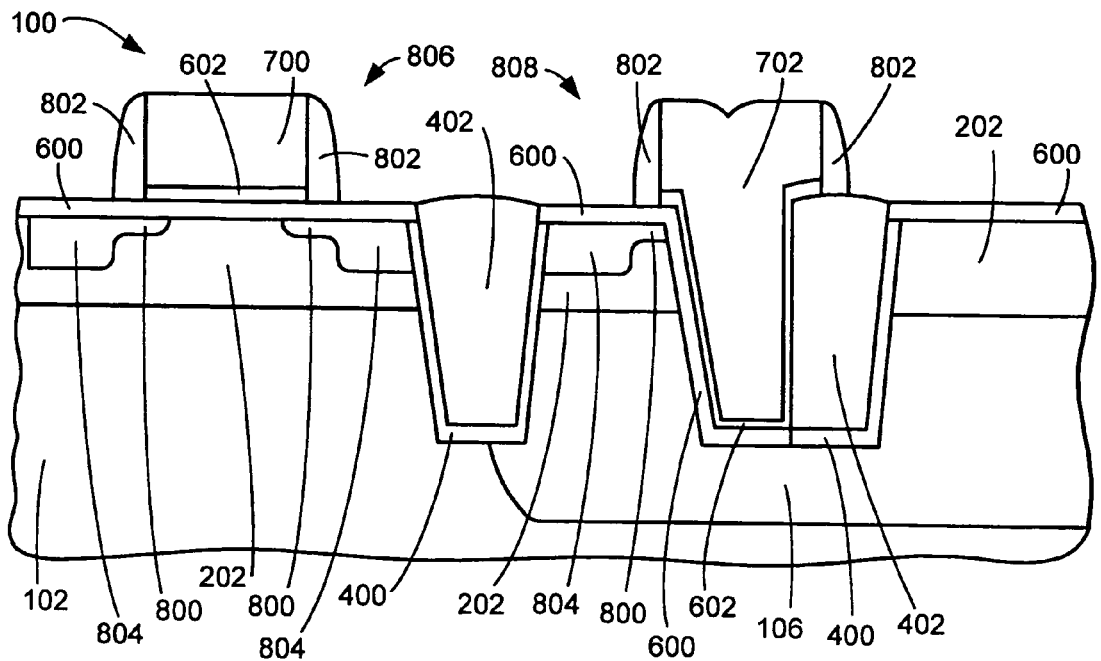
FIG. 8 is the structure of FIG. 7 after removal of the mask and formation of spacers in accordance with the present invention.

Referring now to FIG. 7, therein is shown the structure of FIG. 6 following etching through the gate mask 606 (FIG. 6) of the Poly layer 604 (FIG. 6) and through the exposed portions of the TEOS liner 602 therebeneath to form an access transistor gate 700 for an access transistor 806 (FIG. 8), and to form a thyristor gate 702 for the thyristor 808 (FIG. 8). Both gates are formed from the Poly layer 604. A mask 704 is then formed for a lightly doped drain ("LDD") implantation 800 (see FIG. 8) represented by implantation arrows 706.

Referring now to FIG. 8, therein is shown the structure of FIG. 7 following removal of the mask 704 (FIG. 7) and showing the regions of the LDD implantation 800. Spacers 802 have then been formed around the access transistor gate 700 and the thyristor gate 702. A source/drain ("S/D") mask (not shown) is then formed and, in combination with masking by the spacers 802, defines the area for an S/D implantation 804, following which the S/D mask is removed.

The core components of the access transistor 806 thus formed include the access transistor gate 700 and the adjacent portions of the gate oxide layer 600, the LDD implantation 800, and the S/D implantation 804. Similarly, the core components of the thyristor 808 include the thyristor gate 702 and the adjacent portions of the gate oxide layer 600, the LDD implantation 800, the S/D implantation 804, the P-well implantation 202, and the N-well implantation 106.

Figure 9:
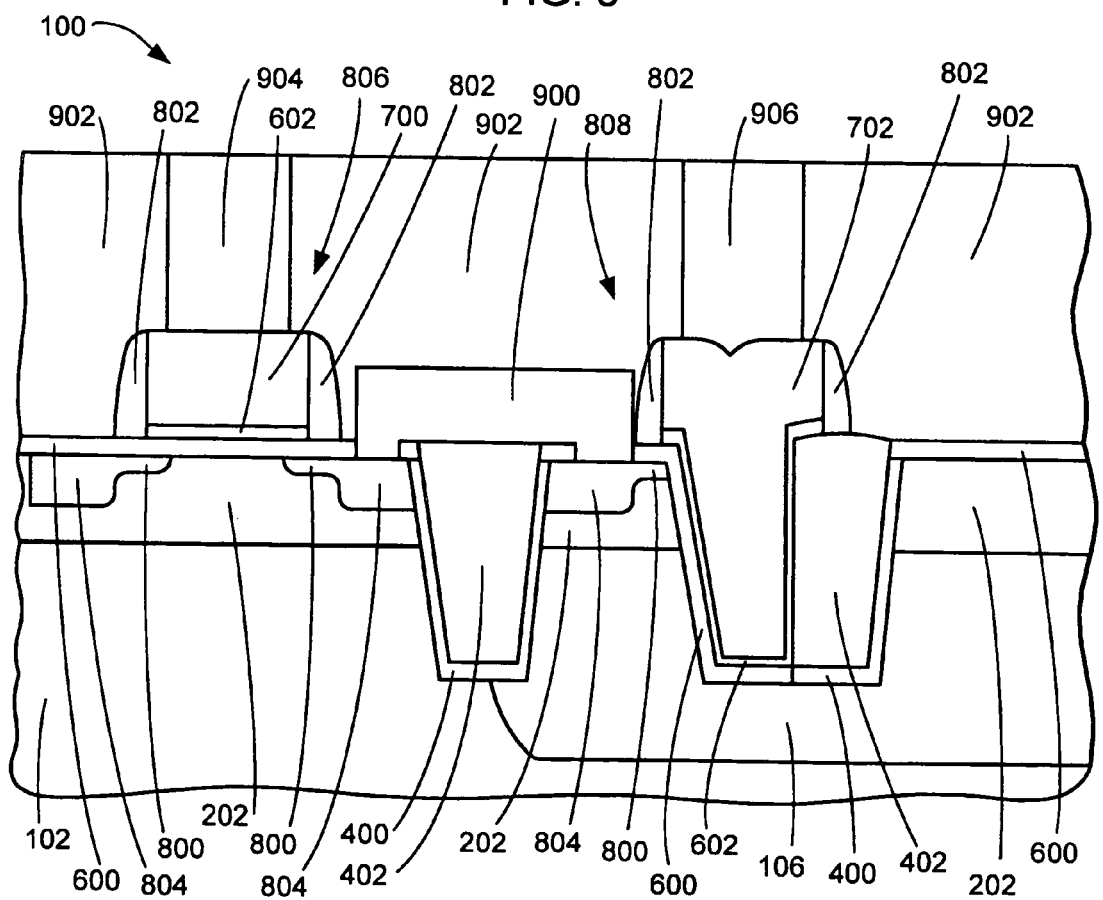
FIG. 9 is the structure of FIG. 8 after formation of a local interconnect between the access transistor and the thyristor.

Referring now to FIG. 9, therein is shown the structure of FIG. 8 following formation of a local interconnect 900 between the access transistor 806 and the thyristor 808. The local interconnect 900 may be formed, for example, in a known manner such as used for contact formation. For example, the device at this stage would be masked, etched, and tungsten filled to form the local interconnect.

The device is then completed by means of an interlayer dielectric ("ILD") layer 902 and the provision of electrical contacts 904 and 906 for the access transistor gate 700 and the thyristor gate 702, respectively. Additional finishing steps include provision of other electrical contacts (not shown) as are customary, and finishing with CMP and other conventional finishing steps.

While not shown in FIG. 9, it will be understood that the various electrical contacts, such as the electrical contacts 904 and 906, will not customarily all be co-planar, which is common practice in the art to enable efficient electrical contacts to be formed in a device having very closely spaced components.

Figure 10:
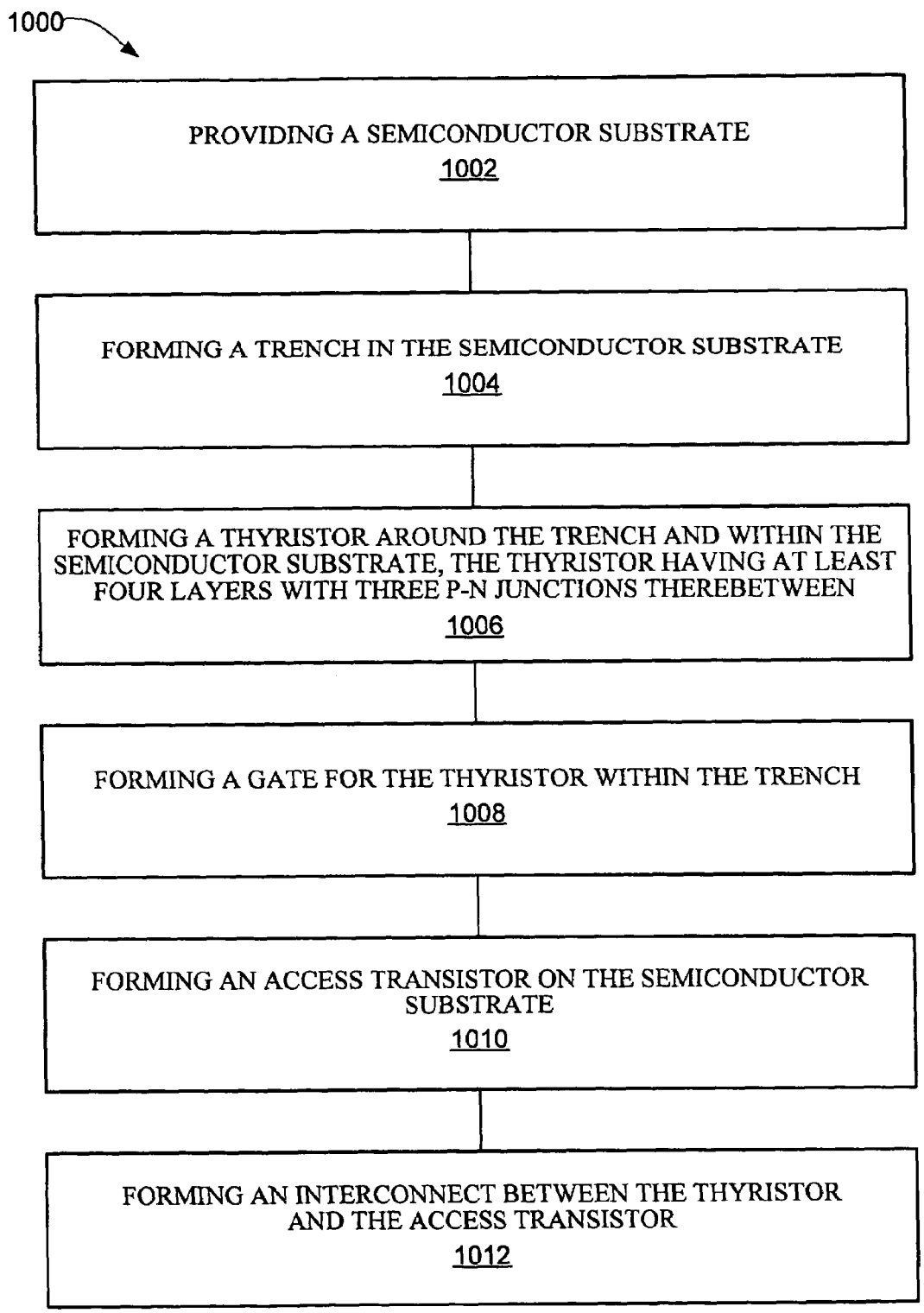
FIG. 10 is a flow chart of a method for providing horizontal thyristor-based SRAM devices in accordance with the present invention.

Referring now to FIG. 10, therein is shown a flow chart of a method 1000 for providing horizontal thyristor-based SRAM devices in accordance with the present invention. The method includes a step 1002 of providing a semiconductor substrate; a step 1004 of forming a trench in the semiconductor substrate; a step 1006 of forming a thyristor around the trench and within the semiconductor substrate, the thyristor having at least four layers with three P-N junctions therebetween; a step 1008 of forming a gate for the thyristor within the trench; a step 1010 of forming an access transistor on the semiconductor substrate; and a step 1012 of forming an interconnect between the thyristor and the access transistor.

In greater detail, a manufacturing method to produce the horizontal TRAM according to the present invention is performed as follows:

1. The semiconductor substrate 102 is suitably prepared, the N-well mask 104 is patterned and formed thereon, and the N-well implantation 106 is performed. (FIG. 1)
2. The N-well mask 104 (FIG. 1) is then removed, the P-well mask 200 is patterned and formed on the semiconductor substrate 102, and the P-well implantation 202 is performed through the P-well mask 200. (FIG. 2)

3. The P-well mask 200 (FIG. 2) is removed, the active mask 300 for the first STI trench 302 and the second STI trench 304 is patterned and formed on the semiconductor substrate 102, and the STI trenches are then etched therethrough. (FIG. 3)

4. The oxide liner 400 is formed on and across the semiconductor substrate 102, the first STI trench 302 (FIG. 3), and the second STI trench 304 (FIG. 3). The STI trenches are then filled with the STI gapfill 402, and CMP is performed thereon. (FIG. 4)

5. The exposed portions of the oxide liner 400 are removed, the Poly mask 500 is deposited, and the thyristor gate well 504 is formed by etching the STI beneath the opening 502 in the Poly mask 500. (FIG. 5)

6. The Poly mask 500 (FIG. 5) is removed and the gate oxide layer 600 and the TEOS liner 602 are formed over and across the semiconductor substrate 102 and the various structures thereon, following which the Poly layer 604 is deposited on the TEOS liner 602. The gate mask 606 for the access transistor gate 700 (FIG. 7) and the thyristor gate 702 (FIG. 7) is then patterned and formed on the Poly layer 604. (FIG. 6)

7. The Poly layer 604 (FIG. 6) is then etched through the gate mask 606 (FIG. 6) to form the access transistor gate 700 and the thyristor gate 702 from the Poly layer 604. The unprotected portions of the TEOS liner 602 are etched away at the same time. The mask 704 for the LDD implantation 800 (FIG. 8) is patterned and formed, following which the LDD implantation 800 takes place. (FIG. 7)

8. The mask 704 (FIG. 7) is removed, the spacers 802 are formed, and the S/D implantation 804 is performed. (FIG. 8)

9. The local interconnect 900 is formed, then the ILD layer 902 is deposited thereover and the contacts, including the electrical contacts 904 and 906, are formed therethrough. This is followed by CMP and other conventional finishing steps for the device. (FIG. 9)

It has been discovered that the present invention has numerous advantages. Principal among these is the compatibility of the present invention with conventional bulk complimentary metal oxide semiconductor ("CMOS") processing, with the addition of a poly and an implantation module.

The invention provides an embedded static read/write random-access memory ("SRAM") design utilizing a negative-channel metal-oxide semiconductor ("NMOS") TRAM for ultra-high cell density.

Epitaxy is not required because the TRAM is fabricated horizontally by forming its NPNP semiconductor material layers around a trench.

The resulting process is straightforward, economical, uncomplicated, highly versatile, uses conventional technologies, and is thus readily suited for manufacturing ultra-high cell density devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hitherto-fore set forth herein or shown in the accompanying drawings are to be interpreted in an illustrative and non-limiting sense.

The invention claimed is:

1. A method for manufacturing an integrated circuit structure, comprising:
   providing a semiconductor substrate;
   forming a trench in the semiconductor substrate;
   forming a thyristor around the trench and on opposite sides thereof within the semiconductor substrate, the thyristor having at least four layers with three P-N junctions therebetween;
   forming a gate for the thyristor within the trench;
   forming an access transistor on the semiconductor substrate; and
   forming an interconnect between the thyristor and the access transistor.

2. The method of claim 1 wherein forming the thyristor around the trench further comprises forming at least two of the thyristor layers horizontally in the semiconductor substrate and at least two of the thyristor layers vertically in the semiconductor substrate.

3. The method of claim 2 wherein:
   forming at least two of the thyristor layers vertically further comprises forming the layers vertically adjacent the trench, and
   forming the gate for the thyristor within the trench further comprises forming the gate for the thyristor adjacent at least one of the vertically formed layers.

4. The method of claim 1 wherein forming the thyristor around the trench further comprises forming the trench within at least one of the four thyristor layers.

5. The method of claim 1 wherein forming the interconnect includes forming a local interconnect above the semiconductor substrate connecting the thyristor and the access transistor.

6. A method for manufacturing an integrated circuit structure, comprising:
   providing a semiconductor substrate;
   forming a first well in the semiconductor substrate;
   forming a second well in the semiconductor substrate extending across at least a portion of the first well;
   forming a first shallow trench isolation extending both inside and outside the first well;
   forming a second shallow trench isolation in bob the first well and the second well;
   forming a thyristor within the semiconductor substrate and around the second shallow trench isolation, the thyristor having at least four layers with three P-N junctions therebetween;
   forming a gate for the thyristor within the second shallow trench isolation;
   forming an access transistor on the semiconductor substrate adjacent the first shallow trench isolation and outside the first well, the access transistor including an access transistor gate formed above the semiconductor substrate; and
   forming an interconnect between the thyristor and the access transistor whereby a horizontal TRAM is formed.

7. The method of claim 6 wherein fanning the thyristor around the second shallow trench isolation further comprises forming at least two of the thyristor layers horizontally in the semiconductor substrate and at least two of the thyristor layers vertically in the semiconductor substrate.

8. The method of claim 7 wherein:
forming at least two of the thyristor layers vertically further comprises forming the layers vertically adjacent the second shallow trench isolation, and
forming the gate for the thyristor within the second shallow trench isolation further comprises forming the gate for the thyristor adjacent at least one of the vertically fanned layers.

9. The method of claim 6:
further comprising forming spacers around the thyristor gate and the access transistor gate, the spacers being formed above the semiconductor substrate; and
wherein forming the thyristor and forming the access transistor further comprise forming source and drain regions in the semiconductor substrate adjacent the spacers.

10. The method of claim 6 further comprising:
forming the interconnect by forming a local interconnect above the semiconductor substrate, across the first shallow trench isolation, and between the thyristor and the access transistor;
depositing an interlayer dielectric layer over at least the thyristor and the access transistor; and
forming at least one electrical contact through the interlayer dielectric layer to the thyristor and at least one electrical contact through the interlayer dielectric layer to the access transistor.

11. A method for manufacturing an integrated circuit structure, comprising:
providing a semiconductor substrate;
forming a trench in the semiconductor substrate;
forming a thyristor around the trench and within the semiconductor substrate, the thyristor having at least four layers with three P-N junctions therebetween, at least two of the P-N junctions being located horizontally with respect to each other in the semiconductor substrate and at least two of the P-N junctions being located vertically with respect to each other in the semiconductor substrate;
forming a gate for the thyristor within the trench;
forming an access transistor on the semiconductor substrate; and
forming an interconnect between the thyristor and the access transistor.

12. The method of claim 11 wherein forming the thyristor around the trench further comprises forming at least two of the thyristor layers horizontally in the semiconductor substrate and at least two of the thyristor layers vertically in the semiconductor substrate.

13. The method of claim 12 wherein:
forming at least two of the thyristor layers vertically further comprises forming the layers vertically adjacent the trench, and
forming the gate for the thyristor within the trench further comprises forming the gate for the thyristor adjacent at least one of the vertically formed layers.

14. The method of claim 11 wherein forming the thyristor around the trench further comprises forming the trench within at least one of the four thyristor layers.

15. The method of claim 11 wherein forming the interconnect includes forming a local interconnect above the semiconductor substrate connecting the thyristor and the access transistor.

* * * * *

UNITED STATES PATENT AND TRADEMARK OFFICE
CERTIFICATE OF CORRECTION

| | | |
|---|---|---|
| PATENT NO. | : 7,081,378 B2 | Page 1 of 1 |
| APPLICATION NO. | : 10/752357 | |
| DATED | : July 25, 2006 | |
| INVENTOR(S) | : Zheng et al. | |

It is certified that error appears in the above-identified patent and that said Letters Patent is hereby corrected as shown below:

Column 8

Claim 3, line 28, delete "fUrther" and insert therefor --further--

Claim 6, line 47, delete "bob" and insert therefor --both--

Claim 7, line 63, delete "fanning" and insert therefor --forming--

Column 9

Claim 8, line 8, delete "fanned" and insert therefor --formed--

Signed and Sealed this

Nineteenth Day of September, 2006

JON W. DUDAS
*Director of the United States Patent and Trademark Office*